United States Patent [19]
Meinel et al.

[11] Patent Number: 5,353,001
[45] Date of Patent: Oct. 4, 1994

[54] HYBRID INTEGRATED CIRCUIT PLANAR TRANSFORMER

[75] Inventors: Walter B. Meinel; R. Mark Stitt, II, both of Tucson, Ariz.

[73] Assignee: Burr-Brown Corporation, Tucson, Ariz.

[21] Appl. No.: 969,508

[22] Filed: Oct. 30, 1992

Related U.S. Application Data

[63] Continuation of Ser. No. 645,224, Jan. 24, 1991, abandoned.

[51] Int. Cl.$^5$ .................. H01F 27/26; H01F 27/30
[52] U.S. Cl. .................. 336/83; 29/602.1; 336/96; 336/200; 336/212; 363/125
[58] Field of Search .................. 336/200, 212, 232, 83, 336/96; 29/602.1, 606; 363/125

[56] References Cited

U.S. PATENT DOCUMENTS

| | | | |
|---|---|---|---|
| 3,833,872 | 9/1974 | Marcus et al. | 336/83 |
| 4,012,703 | 3/1977 | Chamberlayne | 333/24 R |
| 4,424,504 | 1/1984 | Mitsui et al. | 336/83 |
| 4,506,238 | 3/1985 | Endoh et al. | 333/138 |
| 4,538,132 | 8/1985 | Hiyama et al. | 336/221 |
| 4,628,148 | 12/1986 | Endou | 174/52 PE |
| 4,641,114 | 2/1987 | Person | 333/161 |
| 4,730,241 | 3/1988 | Takaya | 363/19 |
| 4,745,388 | 5/1988 | Billings et al. | 336/192 |
| 4,800,356 | 1/1989 | Ellis | 336/184 |
| 4,864,486 | 9/1989 | Spreen | 363/126 |
| 4,914,561 | 4/1990 | Rice et al. | 363/126 |
| 4,939,494 | 7/1990 | Massuda et al. | 336/96 |

FOREIGN PATENT DOCUMENTS

| | | | |
|---|---|---|---|
| 310396 | 3/1989 | European Pat. Off. | 336/200 |
| 318955 | 6/1989 | European Pat. Off. | 336/200 |
| 2409881 | 9/1975 | Fed. Rep. of Germany | 336/83 |
| 2230587 | 4/1980 | Fed. Rep. of Germany | 336/200 |
| 2917388 | 11/1980 | Fed. Rep. of Germany | 336/200 |
| 4721490 | 1/1968 | Japan | 336/200 |
| 54-105729 | 8/1979 | Japan . | |
| 54-110424 | 8/1979 | Japan | 336/200 |
| 2163603 | 2/1986 | United Kingdom | 336/200 |

OTHER PUBLICATIONS

IBM Technical Disclosure Bulletin, "Low-Modulus Encapsulation System", by R. Braune, vol. II, No. 8, Jan. 1969, p. 904.

"Voltage Resonant Buck-Boost Converter Using Multi-Layer-Winding Transformer", Shoyama et al, 1989 IEEE, pp. 895-901.

*Primary Examiner*—Thomas J. Kozma
*Attorney, Agent, or Firm*—Cahill, Sutton & Thomas

[57] ABSTRACT

A planar transformer includes a multilayer printed circuit board having a plurality of spiral windings formed by metalization on various surfaces of the printed circuit board. A ferrite core assembly includes first and second core sections disposed on opposite sides of the printed circuit board and completely confining the conductors of the spiral windings. Each core section includes a thin, flat plate. The two flat plates are integral with or abut thin post sections that are thick enough to allow the printed circuit board to be accommodated between the first and second core sections. In one embodiment of the invention, the planar transformer is incorporated on the printed circuit board with other circuitry to form a low noise battery charger which is encapsulated in a male power connector.

3 Claims, 4 Drawing Sheets

HYBRID INTEGRATED CIRCUIT PLANAR TRANSFORMER

This application is a continuation of my co-pending application Ser. No. 645,224, filed on Jan. 24, 1991 now abandoned and entitled "HYBRID INTEGRATED CIRCUIT PLANAR TRANSFORMER".

BACKGROUND OF THE INVENTION

The invention relates to miniature transformers that are useful in hybrid integrated circuits, and more particularly to planar transformers having primary and secondary spiral windings imprinted on a circuit board, with a ferrite core formed by two ferrite sections, each including a thin, flat plate and separated from the other by two post sections and also supported by the circuit board.

Hybrid electronic integrated circuits often are constructed using transfer molded packaging techniques to produce low cost electrical/electronic functions in a single conventional package, such as a dual-in-line package (DIP). Inclusion of magnetic components such as transformers in hybrid integrated circuits has always presented a major challenge, because the transformer cores required usually have large cross-sectional areas. Such large cross-sectional areas are inconsistent with the need to provide circuit functions in small packages. Commonly assigned U.S. Pat. No. 4,103,267, by Olschewski and U.S. Pat. No. 4,847,986, by Meinel, indicate prior successful techniques for including miniature transformers in hybrid integrated circuits. However, the torroidal transformer components disclosed in the two foregoing references are not small enough to fit within a DIP package or the like. Also, a large number of wire bonding steps are required to complete the windings of these references, increasing the time and cost of manufacture. Also, the large number of wire bonded connections reduces reliability.

A prior art transformer 10 that is formed on a conventional printed circuit board, typically used for isolation amplifiers and DC-to-DC converters, is shown in FIG. 1. Spiral windings 12A and 13A are provided around holes 14A on one or more surfaces of printed circuit board 11. A ferrite core for transformer 10 includes an upper U-shaped section 18A and a lower U-shaped section 20A. The cross-sections of both sections 18A and 20A are square and uniform. The corresponding faces 20D on the legs 20C are attached by metal clips. The prior art transformer of FIG. 1, occupies a volume of approximately ¾'s of an inch on each side. The transformer 10 of FIG. 1 is inherently too large to be used in a hybrid integrated circuit. Its cross-section is uniform, probably because any reduction in the area of the magnetic flux path through the core of a transformer increases the amount of heat dissipated in the core and decreases transformer efficiency.

There are a variety of electronic products which are powered by rechargeable batteries. The functional operation of some electronic products, including some powered by rechargeable batteries, is made unreliable by the presence of electrical noise. In other products the presence of electrical noise causes sounds which are distracting to the user. Portable cellular telephones are an example of a noise-sensitive product. Some such products contain integral battery chargers that convert AC line voltage to low DC voltage levels at which conventional integrated circuit components can operate. It is important that the integral battery charger not introduce sufficient electrical noise to interfere with the reliable operation of the portable cellular telephone. There is an unmet need for a smaller, high efficiency, high frequency, low noise transformer that can be incorporated as part of an AC-to-DC or other circuit converter in a small hybrid integrated circuit package, such as a DIP package, or in a power connecter assembly.

SUMMARY OF THE INVENTION

Accordingly, it is an object of the invention to provide an improved, reduced size hybrid integrated circuit transformer that is particularly suitable for low noise applications.

It is another object of the invention to provide an improved planar hybrid integrated circuit transformer which can be incorporated in a thin conventional DIP package or the like.

It is another object of the invention to provide an improved technique for manufacturing a miniature hybrid integrated circuit transformer which can be incorporated on a printed circuit board with other hybrid IC components and encapsulated in a miniature package such as a DIP package or the like.

It is another object of the invention to provide a miniature integrated circuit transformer which can be encapsulated within a package having a thickness of as little as approximately 0.17 inches.

It is another object of the invention to provide a hybrid integrated circuit transformer that is more reliable than the closest prior art hybrid integrated circuit transformers.

It is another object of the invention to provide a hybrid integrated circuit transformer that can be included with input and output circuitry of a signal coupler circuit on a printed circuit board and easily encapsulated in a small package.

It is another object of the invention to provide a hybrid integrated circuit transformer that can be easily encapsulated in a small power connector.

Briefly described, an in accordance with one embodiment thereof, the invention provides a planar transformer including a printed circuit board having first and second parallel surfaces. A first spiral winding is provided on one of the first and second surfaces surrounding a first magnetic flux path area. A second spiral winding is provided on one of the first and second surfaces surrounding a second magnetic flux path area. A ferrite core includes a first core section and a second core section, each of which includes a thin, flat ferrite plate. First and second thin flat post sections are disposed between the plates, the first and second core sections being disposed on opposite sides of the printed circuit board. The thin ferrite plates extend beyond the conductors of the first and second windings and thereby shield emission of electromagnetic signals and noise arising from currents in the windings. In one embodiment of the invention, the printed circuit board has openings through which the post sections extend. In another embodiment of the invention, the post sections extend along opposite edges of the printed circuit board. In one described embodiment of the invention, the planar transformer is formed on the printed circuit board along with other hybrid integrated circuit components to form a low noise, low interference battery charger which is encapsulated in a power connector. In another embodiment, the planar transformer is formed on the printed circuit board along with other hybrid integrated circuit components to form a low noise, low interference signal coupler.

DETAILED DESCRIPTION OF THE PREFERRED EMBODIMENTS

Figure 1:
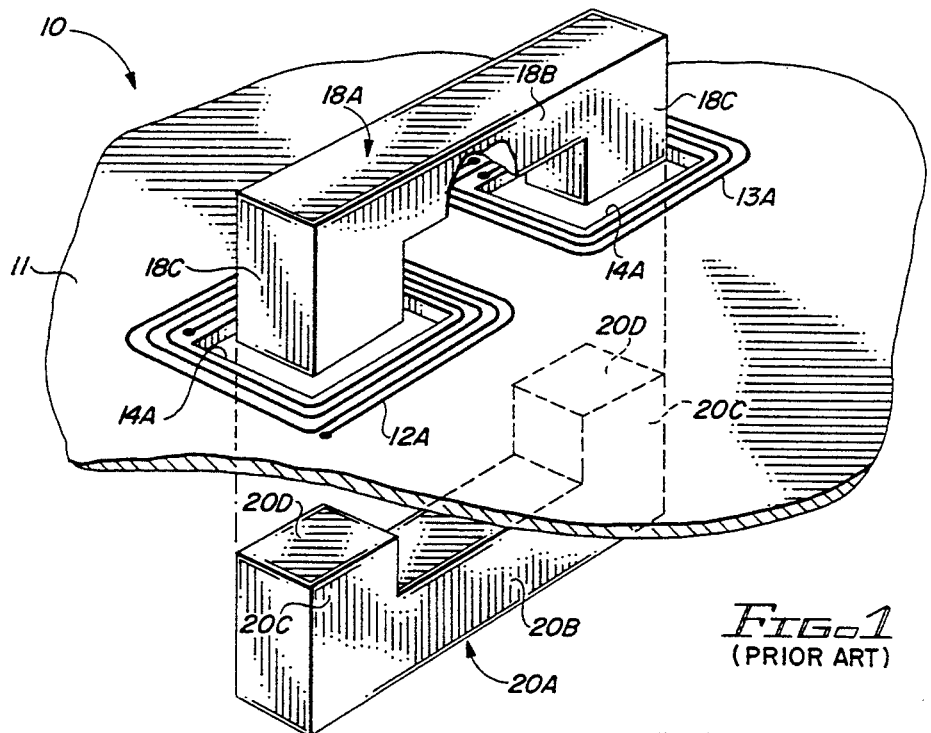
FIG. 1 is an exploded partial perspective view of a prior art transformer.
Figure 2:
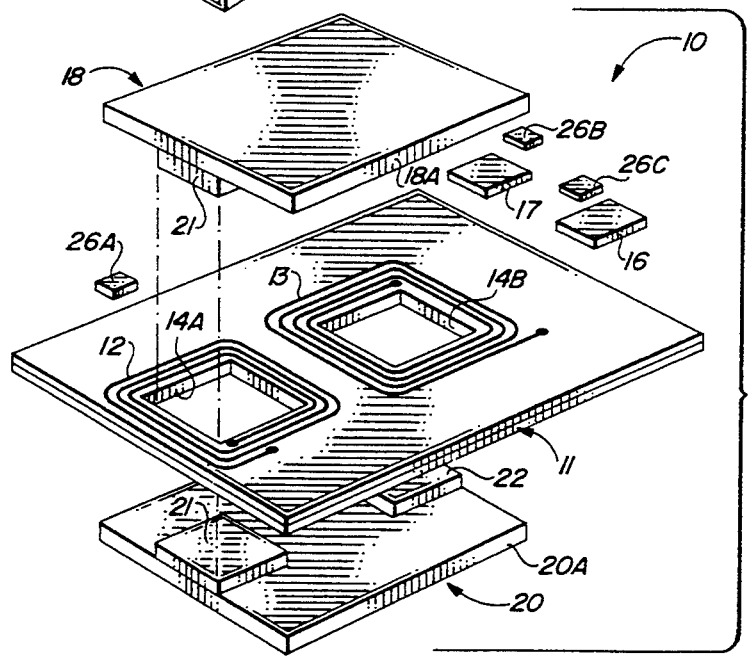
FIG. 2 is a partial perspective exploded view of the planar transformer of one embodiment of the present invention.

Referring to FIG. 2, planar transformer 10 includes a multilayer printed circuit board 11 having holes 14A and 14B therein. A first spiral winding 12 is etched on the upper surface of printed circuit board 11. Preferably, the winding 12 which appears in FIG. 2 is connected in series with several additional essentially identical spiral windings etched on other surfaces of the various layers of printed circuit board 11 to provide a sufficient number of turns around flow path opening 14A.

Similarly, spiral windings 13 are etched in a metalization pattern on the upper surface of printed circuit board 11. Winding 13 in FIG. 2 also may be connected in series with other essentially identical etched spiral windings, respectively, on other surfaces of the various layers of printed circuit board 11 to provide more turns around flux path 14B, so as to thereby achieve higher transformer efficiency. Note that if it is desirable to increase the secondary-to-primary breakdown voltage of the transformer, electrically insulative coatings can be formed on part of the exposed spiral windings. In this way, primary-to-secondary isolation of many thousands of volts can be achieved.

Various other conventional hybrid integrated circuit components are bonded to the surfaces of printed circuit board 11. For example, reference numerals 26A, 26B, and 26C designate a semiconductor diode, a semiconductor diode bridge circuit, and an oscillator driver (or controller) integrated circuit, respectively. Numeral 16 designates an input filter capacitor and numeral 17 designates a resonant capacitor both of which are bonded onto the upper surface of printed circuit board 11 to form the battery charger circuit shown in FIG. 8. Bonding pads or terminals of the various foregoing components are wire bonded onto lead frame members such as 25 in FIG. 3 or other etched conductors (not shown) in the metalization pattern on the surface or surfaces of printed circuit board 11.

Still referring to FIG. 2, planar transformer 10 includes two diametrically opposed ferrite core half sections 18 and 20, which include thin (0.040 inches) flat plates 18A and 20A, respectively. Each of thin plates 18A and 20A includes two ferrite "posts" 21 and 22 extending into holes 14A and 14B. As subsequently explained, the two ferrite core half sections 18 and 20 are pressed together so that the flat surfaces of both posts 21 abut each other and the flat surfaces of both posts 22 abut each other.

In one embodiment, the thin plates 18A and 20A are 0.48 inches by 0.35 inches. The thickness of each of plates 18A and 20A (without posts 21 and 22) is 0.040 inches. The height of each of posts 21 and 22 is 0.020 inches. Posts 21 and 22 are square, 0.115 inches on each side. The ferrite core half sections 18 and 20 are formed of $MnO + ZnO + Fe2O3$ material, marketed as H63B by FDK Company (Fuji Chemical Company) of Japan.

Square holes 14A and 14B are 0.130 inches on each side, leaving a clearance of 0.0075 inches to posts 21 and 22. In the embodiment of the planar transformer shown in FIG. 2, winding 12, has 10 turns and winding 13 has 60 turns.

In accordance with the present invention, all of the turns of windings 12 and 13 are located between thin ferrite plates 18A and 20A, which extend well beyond the side edges of posts 21 and 22. This structure has the advantage of confining electrical signals and electrical noise produced by currents through windings 12 and 13, because the ferrite plates 18A and 18B perform the function of electrically shielding the windings, thereby preventing electromagnetic emission of interfering electrical signals and noise due to the currents in the windings of transformer 10.

By making the cross-sectional areas of plates 18A and 20A thin and wide, the necessary inductance of typically 800 microhenrys for winding 12 is achieved, and the cross-sectional areas are made large enough to keep the magnetic flux density low enough to prevent saturation of the core material. Power loss due to saturation of the core is thereby avoided.

Figure 4:
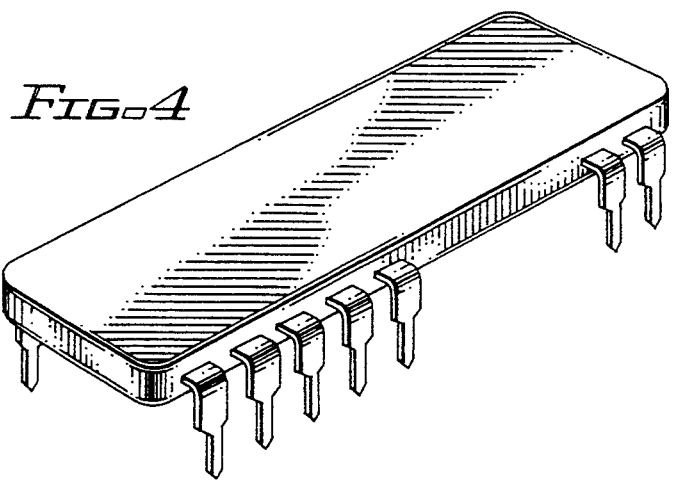
FIG. 4 is a perspective view of a transfer molded DIP package in which the planar transformer of FIG. 2 can be encapsulated.

In the manufacture of planar transformer 10, the printed circuit board 11 is electrically connected to adjacent lead frame members of a transfer molded plastic package such as the one shown in FIG. 4. The components such as capacitors 16 and 17 and semiconductor chips 26A–C are epoxy-attached to the printed circuit board surface and oven cured, using conventional processes. Conventional hybrid integrated circuit wire bonding techniques then are used to make the necessary wire bonds between the bonding pads of the various components and bonding pads of the lead frame and the conductor pattern on the surface(s) of printed circuit board 11. Then, the two ferrite core half sections 18 and 20 are joined together through holes 14A and 14B on printed circuit board 11.

Flexible elevated high temperature core silicone adhesive or flexible (low durometer hardness) epoxy 31 (FIGS. 2 and 3) is used to attach the inner surfaces of ferrite plates 18 and 20 to the upper and lower surfaces of printed circuit board 11, respectively. (Dow Corning SYLGARD 170 silicone adhesive is used in the prototypes under development.) Silicone adhesive or flexible epoxy has a temperature coefficient of expansion lower than the ferrite material of core half sections 18 and 20. The adhesive is oven cured at a temperature higher than the maximum expected operating temperature of planar transformer 10, but lower than the curie temperature of the ferrite core material. When the planar transformer temperature falls to room temperature, the two core halves 18 and 20 then are forced together by tension in the cooled adhesive, forcing the flat surfaces of posts 21 extending into hole 14A of printed circuit board to tightly abut, also forcing the flat surfaces of posts 22 together in hole 14B in printed circuit board 11.

Figure 3:
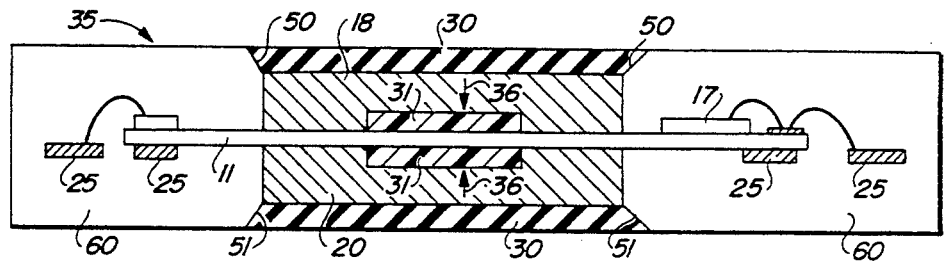
FIG. 3 is a section view diagram useful in describing the structure and method of manufacture of the planar transformer of FIG. 2.

In FIG. 3, arrows 36 show how the core halves 18 and 20 are forced together by the flexible epoxy or silicone adhesive 31 after the assembly has been cooled to ambient temperature. Numeral 25 designates various lead frame members.

In FIG. 3, numeral 35 designates a partial cross-section of a transfer molded plastic DIP package shown in final form in FIG. 4. Before flexible epoxy material 30 is backfilled into openings 50 and 51 in the plastic body 60 of package 35, the outer surfaces of core sections 18 and 20 are exposed. The flexible epoxy material 30 is backfilled into holes 50 and 51. This structure, combined with the flexibility of silicone or epoxy 31, permits ferrite core half sections 18 and 20 to move slightly due to magnetostriction, reducing core energy losses. The ferrite core half sections 18 and 20 can be coated with a low modulus material prior to transfer molding so they will be more free to move slightly due to magnetostriction.

The above described structure of the ferrite core half section, with thin plates 18 and 20 and the square ferrite posts 21 and 22 minimizes the overall thickness of the planar transformer and increases the number of turns of windings 12 and 13 that can be provided to achieve particular inductances, compared to the closest prior art hybrid integrated circuit transformers.

Figure 5A:
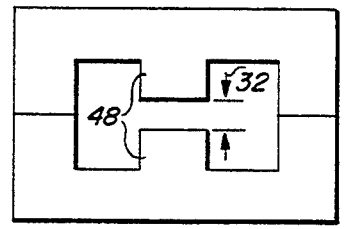
FIG. 5A is a plan view diagram useful in explaining operation of the embodiment of the invention shown in FIG. 5.
Figure 5:
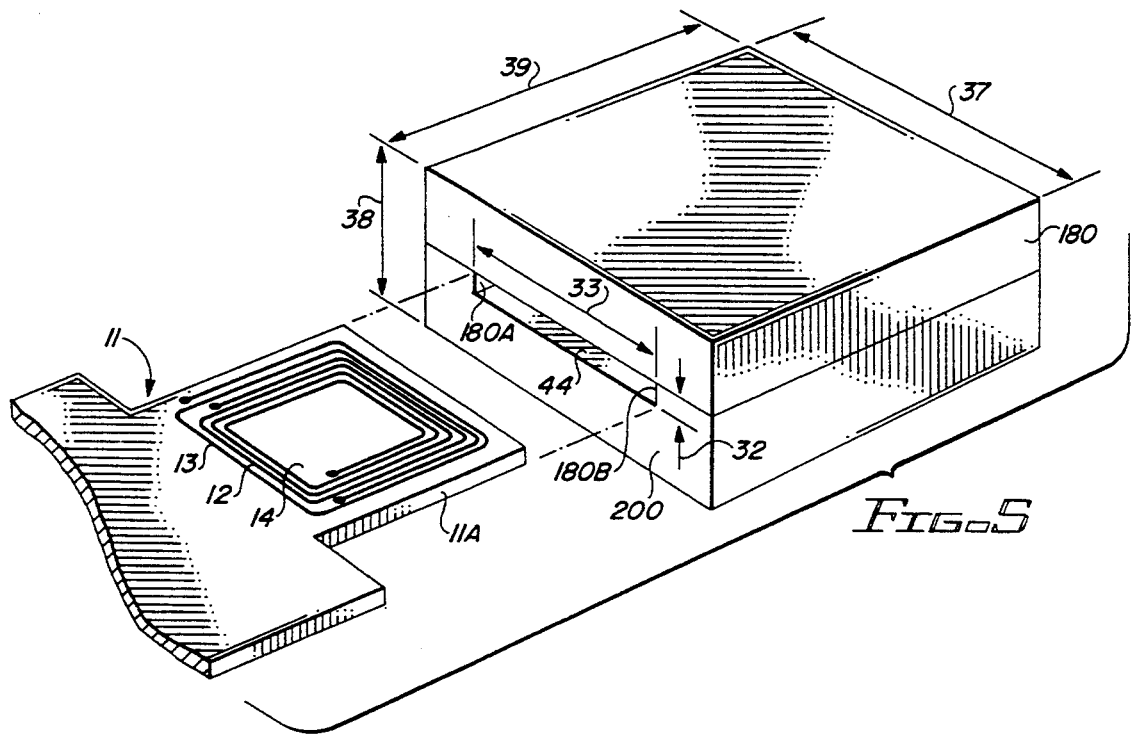
FIG. 5 is a partial perspective view of another embodiment of the invention.

FIG. 5 shows a partial exploded view of another embodiment of the invention, in which printed circuit board 11 has a "tongue" section 11A on which windings 12 and 13 are formed generally concentrically around a common magnetic flux path area 14. Note that where appropriate, the same reference numerals are used to designate identical or similar components in the various drawings. This embodiment of the invention includes a somewhat different ferrite core structure including an upper section 180 and a lower section 200 having two post sections 180A and 180B, one at each end. The two post sections 180A and 180B each can have the same width dimension 39 as the upper and lower core half sections 180 and 200. The upper ferrite core half section 180 is simply a thin flat plate. Post sections 180A and 180B are integral with the thin ferrite plate constituting the lower part of ferrite core half section 200. Core half sections 180 and 200 thereby form a shallow, rectangular hole 44, the height of which is 0.025 inches, as indicated by arrows 32. The width 33 of hole 44 is 0.73 inches. The total thickness of the ferrite core thus formed is 0.305 inches, its length is 1.0 inches, and its width is 0.63 inches, as indicated by dimension lines 38, 37, and 39, respectively. The tongue section 11A of printed circuit board 11 with all of the spiral windings printed thereon extends into rectangular hole 44. The width 39 of ferrite core 180, 200 completely subtends or confines all of the generally concentric windings 12, 13, etc. The core 180,200 could be formed of a single block of ferrite material with hole 44 milled out. The larger core size of the planar transformer of FIG. 5, compared to the one of FIG. 2, was selected to produce more output power).

Figure 6:
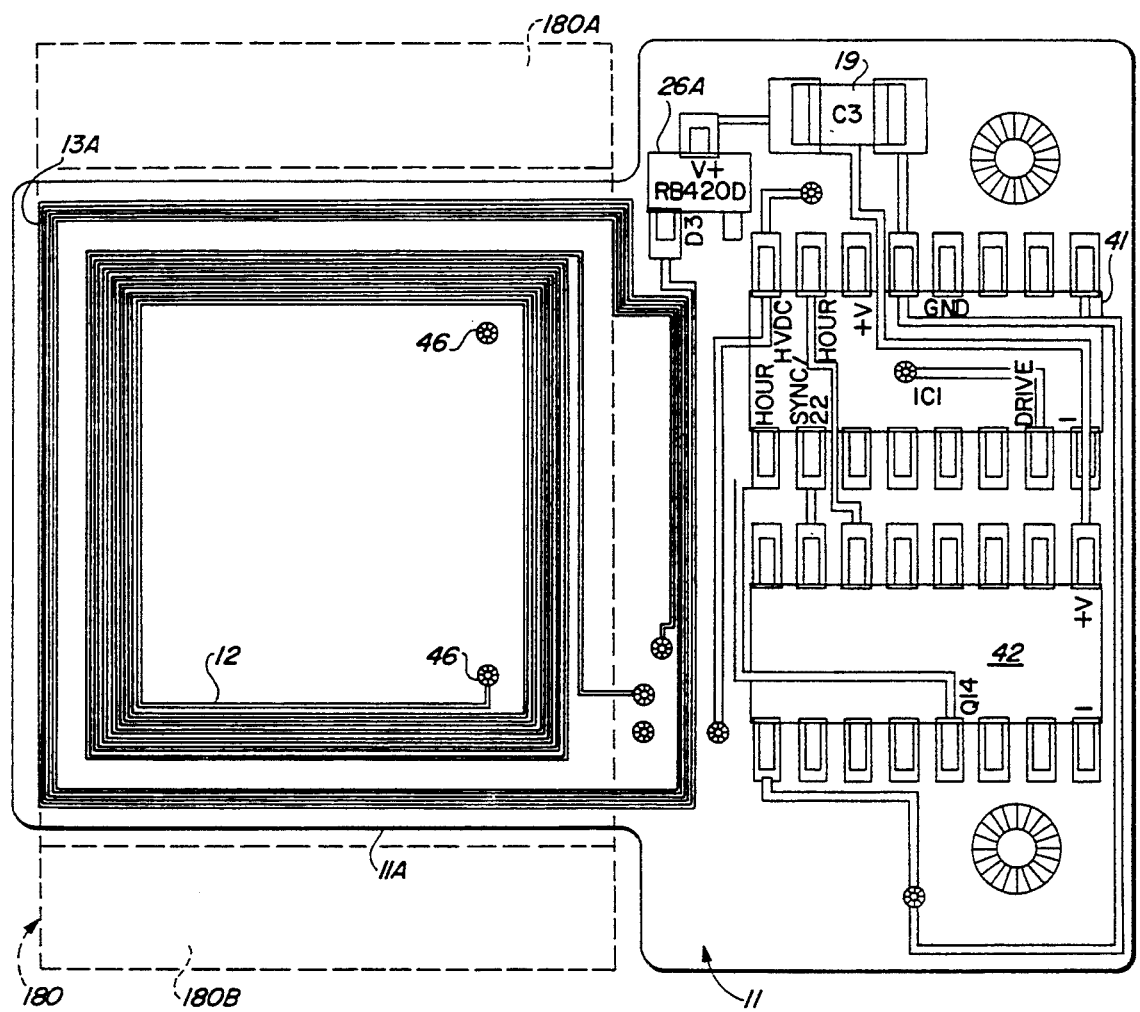
FIG. 6 is a bottom plan view of a printed circuit board including the planar transformer of FIG. 2 as part of a hybrid integrated circuit battery charger.
Figure 6A:
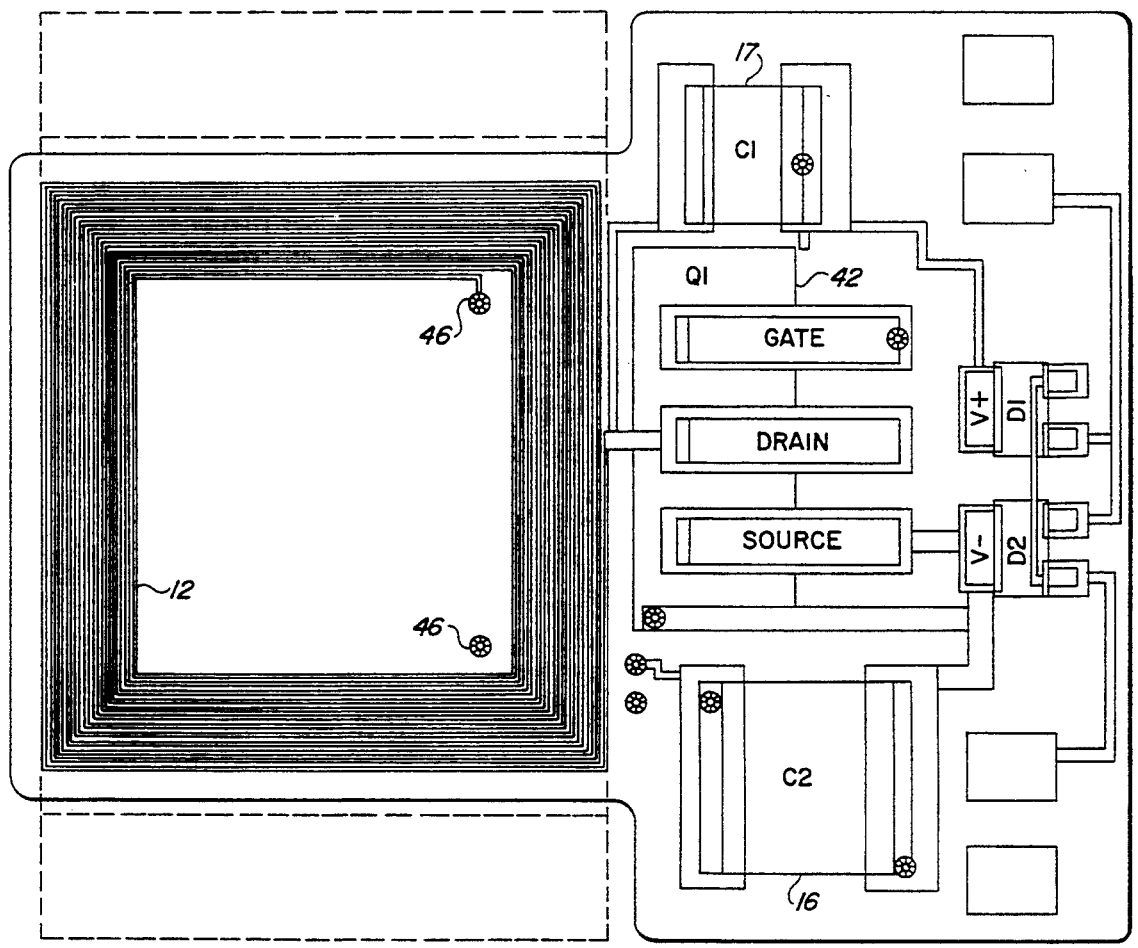
FIG. 6A is a top plan view of the printed circuit board shown in FIG. 6.

FIG. 6 shows a more detailed bottom view of the embodiment of the invention shown in FIG. 5, and FIG. 6A shows a top view thereof. Numeral 46 designates a number of printed circuit board feedthroughs connecting conductors on various surfaces of printed circuit board 11. Numerals 12 designate different, series-connected parts of the primary winding in FIGS. 6 and 6A. Numeral 13A designates a secondary winding used to power other components in the printed circuit board. (Secondary winding 13 of FIG. 8 does not open in FIG. 6A because it is an internal layer of multilayer printed circuit board 11.)

The structure shown in FIGS. 5, 6 and 6A can be thought of as having a gap 32 of 0.025 inches in the ferrite core of 180 and 200. Gap 32 can be thought of as a gap in the center post of a "E" shaped ferrite core half section in a "limiting case" where the length of the center post is zero. FIG. 5A illustrates the point at which a gap 32 is present in a conventional transformer core between two center posts 48, with the windings (not shown) passing around posts 48. In the embodiment of FIG. 5, the post structure is "infinitely shallow" so the length of posts 48 is zero. Magnetic flux passes through gap 32 in the center magnetic flux area 14 of the primary and secondary windings, causing mutual inductive coupling therebetween. Since power loss is inversely proportional to the cross-sectional area of the magnetic flux path surrounded by the windings, the design of FIG. 5 minimizes power loss over the structure shown in FIG. 2, because in the embodiment of FIG. 2 there is a substantial tolerance or clearance between the sides of posts 21 and 22 and the areas surrounded by the turns of the various windings. No magnetic flux passes through this clearance area, so magnetic flux cross-sectional area is reduced.

FIG. 6 shows a computer generated detailed bottom view of the layout of the assembled structure of FIG. 5, the dotted lines showing the ferrite core and the solid lines showing the printed circuit board and components mounted thereon. FIG. 6A shows a similar detailed top view of the layout of the assembled structure of FIG. 5, the dotted lines again showing the ferrite core and the solid lines showing the printed circuit board and components thereon. In FIGS. 6 and 6A, numerals 16 and 17 correspond to the input filter capacitor 16 and resonant capacitor 17 shown in the circuit of FIG. 8. Capacitor 19 is the output filter capacitor shown in FIG. 8.

Figure 7:
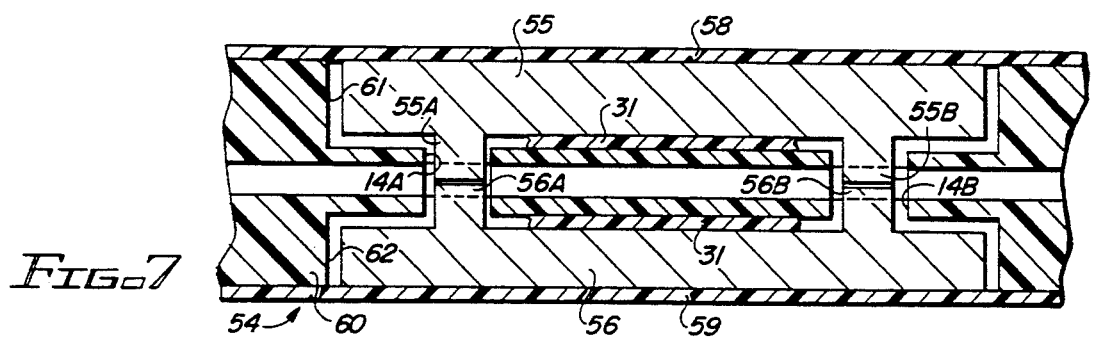
FIG. 7 is a partial section view of another embodiment of the invention wherein the ferrite core is assembled after encapsulation of the printed circuit board in a transfer molded plastic DIP forming cavities that accommodate the ferrite core half sections.

Referring to FIG. 7, another embodiment 54 of the invention is shown in which a transfer molded plastic DIP package, has cavities 61 and 62 in the opposed major surfaces, to allow assembly of the ferrite core half sections 55 and 56 after the rest of the circuit board structure has been encapsulated. Then the upper ferrite core half section 55 is placed in the upper hole 61, with posts 55A and 55B passing through openings 14A and 14B in printed circuit board 11. Similarly, lower ferrite core half section 56 is inserted into hole 62 in the bottom of the package 54. As previously explained with reference to FIG. 3, flexible epoxy or silicone adhesive 31 is used to affix the inner surfaces of the upper and lower core half section 55 and 56 to the upper and lower surfaces of printed circuit board 11, respectively. Oven curing this adhesive at a sufficiently high temperature results in the thin, flat plate sections of ferrite core halves 55 and 56 being tightly drawn together when the assembly is cooled to room temperature, and therefore results in the faces of posts 55B and 56B being tightly drawn together (resulting in a negligible gap in the core structure). Then, suitably marked labels 58 and 59 can be adhesively attached to the upper and lower surfaces of the DIP package to cover the outer surfaces of the upper and lower ferrite core half sections 55 and 56. This structure avoids core losses which otherwise would result from confining of core movement due to magnetostriction.

Figure 8:
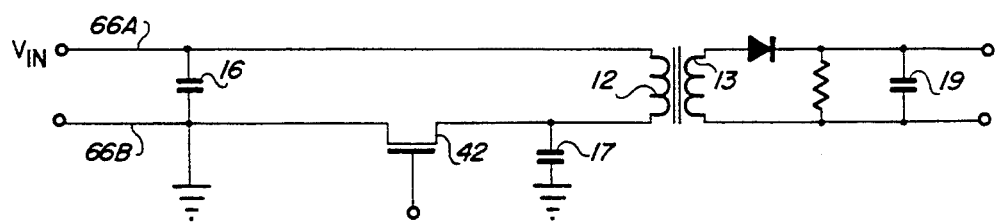
FIG. 8 is a schematic circuit diagram useful in describing a low noise battery charger circuit which can be made conveniently using the hybrid integrated circuit transformer of the present invention.

FIG. 8 shows a schematic diagram of a typical battery charger (AC to DC converter) which can be implemented using any of the planar transformers described above, although the one described with reference to FIGS. 5, 6 and 6A at the present time seems to be most effective. Numerals 16, 17 and 19 designate the same capacitors referred to earlier. This circuit has the advantage of minimizing the number of components required and also minimizes power losses in MOSFET switch 42. A more complete description of an implementation of this battery charger circuit is found in the commonly assigned copending application entitled "COMPACT LOW NOISE LOW POWER DUAL BATTERY CHARGING CIRCUIT", Ser. No. 621,014 filed on Nov. 30, 1991 by Sommerville, incorporated herein by reference. The circuit uses the inductance of the transformer primary winding and the capacitance of the MOSFET switch 42 and capacitor 17 to form a resonant circuit. The off time of the MOSFET switch is equal to one-half of the period of the resonant frequency. The operation frequency is between 500 and 1000 Kilohertz.

Figure 8A:
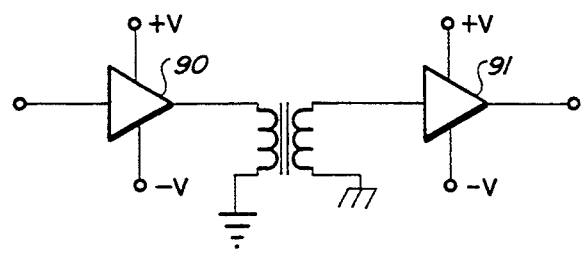
FIG. 8A is a schematic circuit diagram useful in describing an isolation amplifier circuit which can be made conveniently using the hybrid integrated circuit transformer of the present invention.

FIG. 8A shows a typical signal coupler circuit which can be implemented using any of the planar transformer embodiments of the invention described herein. Circuits 90 and 91 in FIG. 8A may be unity gain buffers or digital or analog signal processing circuits and winding drivers.

Figure 9:
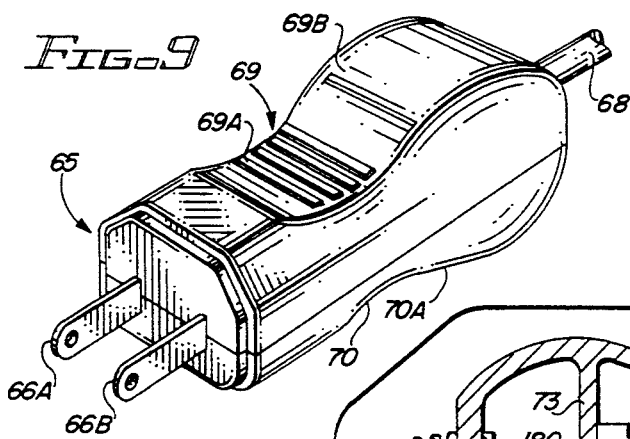
FIG. 9 is a perspective view of a package in the form of an electrical connector that encapsulates the circuit of FIGS. 6 and 6A.

FIG. 9 is a partial perspective view of a male electrical power connector 65 in which the battery charger circuit of FIG. 8 can be encapsulated. Two conductive prongs 66 extend from the flat distal end of connector body 67. A flexible output DC power cord 68 extends from the opposite proximal side of connector 65. A concave rounded, knurled recess 69 is provided on one major surface of connector 65, and a more shallow knurled recess 70 is provided on the opposite face. The user's thumb easily fits into recess 69 and presses against sloped surface 69A of recess 69 to effectuate insertion of the electrical prongs into a female receptacle. Surface 69B of recess 69 and surface 70A of recess 70 enable the user to easily withdraw connector 65 from a power outlet.

Figure 10:
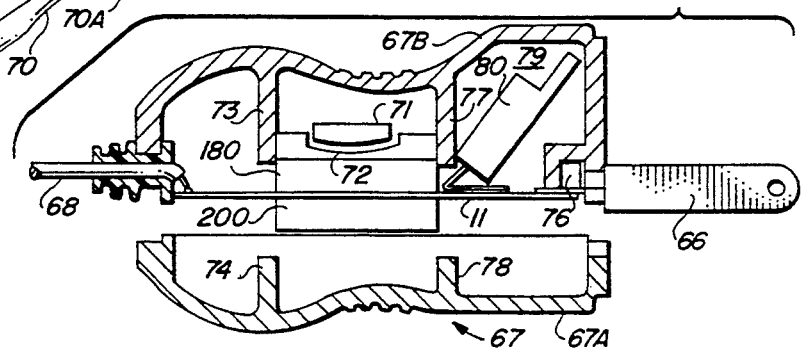
FIG. 10 is a section view of the package of FIG. 9.

FIG. 10 shows a section view diagram of connector 65, wherein it can be seen that housing 67 is mostly hollow. Housing 67 includes a lower section 67A and an upper section 67B. Ribs 73, 74, 77, and 78 define several cavities. Printed circuit board 11 is retained by the ends of ribs 73, 74, 77, and 78. The lower part of ferrite core half section 200 (shown in FIGS. 5, 6, and 6A) extends into a recess between ribs 74 and 78. The upper ferrite core half section 180 extends into a cavity between ribs 73 and 77. An air pocket 71 is located above a resilient horizontal rib 72 which presses down on the upper surface of ferrite core half section 180, forcing it downward against ferrite core half section 200, producing an efficient magnetic flux path through ferrite core 180, 200. Rib 77 and the right end of housing section 67B form a cavity 79 in which a TO220 package 80 is mounted. Package 80 contains the MOSFET switch 42 of FIG. 8, which can be an IRF22BG high voltage MOSFET available from the International Rectifier Corporation. DC output power cord 68 extends through conventional strain relief grommet to PC board 11. Each of prongs 66 has an enlarged head 76 available in a recess in section 67B to retain it therein. A pin (not shown) retains enlarged head 76 in contract with printed circuit board 11.

A very small hybrid integrated circuit transformer with efficient transformer operation with low core losses is achieved by the above describe invention. The described embodiments are advantageous despite discontinuities that may exist in magnetic flux path area in the thin plate sections and the post sections of the core half sections. The large number of wire bonding operations needed to form the windings of the demonstrated prior art is avoided. The reliability of the unit is absolutely increased by elimination of such wire bonds. The physical size is greatly reduced. The electrical interference produced is largely eliminated.

While the invention has been described with reference to several embodiments thereof, those skilled in the art will be able to make various modifications to the described embodiments without departing from the true spirit and scope of the invention.

What is claimed is:
1. A planar transformer comprising in combination:
   (a) a printed circuit board having parallel first and second surfaces;
   (b) a first spiral winding on one of the first and second surfaces surrounding a first magnetic flux path area, and a second spiral winding generally concentric with the first spiral winding on one of the first and second surfaces surrounding a second magnetic flux path area that overlaps the first magnetic flux path area, a portion of the printed circuit board with the first and second spiral windings thereon having a maximum thickness; and
   (c) a ferrite core assembly including
      i. a first core section including a thin, flat first plate,
      ii. a second core section including a thin, flat second plate, spaced thin, flat, elongated first and second post sections disposed between the first and second plates abutting inner surfaces of the first and second plates, forming a shallow gap greater than the maximum thickness bounded by the first and second post sections and inner surfaces of the first and second plates, the portion of the printed circuit board with the first and second spiral windings thereon extending entirely into the shallow gap so that magnetic flux passing through the first and second magnetic flux path areas also passes across the gap.
2. The planar transformer of claim 1 including material holding the first and second plates together.
3. The planar transformer of claim 2 wherein the material includes epoxy attaching inner surfaces of the first and second plates to opposite faces of the printed circuit board.

* * * * *